United States Patent
Chu et al.

(10) Patent No.: US 6,835,626 B2
(45) Date of Patent: Dec. 28, 2004

(54) METHOD TO OVERCOME INSTABILITY OF ULTRA-SHALLOW SEMICONDUCTOR JUNCTIONS

(75) Inventors: Wei-Kan Chu, Houston, TX (US); Lin Shao, Houston, TX (US); Jiarui Liu, Houston, TX (US)

(73) Assignee: University of Houston, Houston, TX (US)

( * ) Notice: Subject to any disclaimer, the term of this patent is extended or adjusted under 35 U.S.C. 154(b) by 0 days.

(21) Appl. No.: 10/621,967

(22) Filed: Jul. 17, 2003

(65) Prior Publication Data

US 2004/0018703 A1 Jan. 29, 2004

Related U.S. Application Data

(60) Provisional application No. 60/397,554, filed on Jul. 22, 2002.

(51) Int. Cl.$^7$ ..................... H01L 21/336; H01L 21/425
(52) U.S. Cl. ..................... 438/301; 438/231; 438/232; 438/305; 438/306; 438/527; 438/530
(58) Field of Search ..................... 438/231, 232, 438/305, 306, 527, 530, 301

(56) References Cited

U.S. PATENT DOCUMENTS

| | | | |
|---|---|---|---|
| 5,169,798 A | | 12/1992 | Eaglesham et al. ............ 437/81 |
| 5,731,626 A | * | 3/1998 | Eaglesham et al. ......... 257/607 |
| 6,037,640 A | * | 3/2000 | Lee ............................. 257/408 |
| 6,362,081 B1 | | 3/2002 | Chuang ....................... 438/522 |
| 6,518,136 B2 | * | 2/2003 | Lee et al. .................... 438/303 |

OTHER PUBLICATIONS

Lin Shao et al. "Stability Studies of Ultra–Shallow Junction Formed by Low Energy Boron Implant and Spike Annealing". J. Appl. Phys. vol. 92, No. 10, pp. 5788–5792 (2002).

P.E. Thompson and J. Bennet, "Formation and Thermal Stability of Ultra–Shallow p+ Junctions in Si and Si1–xGex Formed By Molecular Beam Epitaxy", J. Appl. Phys. vol. 92, No. 11, 6845–6850 (2002).

Aliette Mouroux, et al., "Phase Formation and Resistivity In The Ternary System Ti–Nb–Si", J. Appl. Phys.vol. 86, No. 4, 2323–2329, (1999).

* cited by examiner

*Primary Examiner*—Mary Wilczewski
*Assistant Examiner*—Toniae M. Thomas
(74) *Attorney, Agent, or Firm*—Tim Headley; Cardere Wynne Sewell LLP

(57) ABSTRACT

A method of forming a stable junction on a microelectronic structure on a semiconductor wafer having a silicon surface layer on a substrate includes the following steps: implanting dopant ions into the surface layer; cleaning and oxidizing the surface layer, and twice annealing the wafer to recover a damaged silicon crystal structure of the surface layer resulting from the low energy ion implantation. The first annealing process uses a temperature range of 800° C. to 1200° C. for a duration from about a fraction of a second to less than about 1000 seconds, with a ramp-up rate of about 50° C./second to about 1000° C./second. The second annealing process uses a temperature range of 400° C. to 650° C. for a time period of from about 1 second to about 10 hours, and more preferably, from about 60 seconds to about 1 hour. Both annealing processes include cooling processes.

4 Claims, 2 Drawing Sheets

METHOD TO OVERCOME INSTABILITY OF ULTRA-SHALLOW SEMICONDUCTOR JUNCTIONS

CROSS-REFERENCE TO RELATED APPLICATIONS

This application claims the benefit of the following U.S. Provisional Application: No. 60/397,554, filed Jul. 22, 2002

STATEMENT REGARDING FEDERALLY SPONSORED RESEARCH OR DEVELOPMENT

Not Applicable.

REFERENCE TO A "SEQUENTIAL LISTING," A TABLE, OR A COMPUTER PROGRAM LISTING APPENDIX SUBMITTED ON A COMPACT DISC

Not Applicable.

BACKGROUND OF THE INVENTION

1. Field of the Invention

The present invention relates to microelectronics and, in particular, to a method of fabricating an ultra-shallow junction in Field Effect Transistor (FET) devices, such as Bipolar and Complementary Metal Oxide Semiconductor (CMOS) devices. As used in this patent, an "FET" comprises a micro-electronic device having a source region and a drain region formed in mutually spaced adjacency in the surface of a semiconductor substrate, having a pair of the shallow implant regions being disposed between and formed as spaced-apart extensions of source and drain regions to form a channel region between the spaced-apart shallow implant regions, and a gate electrode overlying the channel region.

2. Description of Related Art

Advances in the miniaturization of CMOS devices have been a key driving force behind the explosive growth of various network centric computing products. Smaller CMOS devices typically equate to faster switching times that lead to faster and better performance.

The process of miniaturizing CMOS devices involves scaling down various horizontal and vertical dimensions of the CMOS device structure. In particular, the thickness of the ion implanted source/drain junction of a p-type or n-type transistor can be scaled down with a corresponding scaled increase in the substrate channel doping. Continued scaling of silicon device dimensions down to sub-100 nm dimensions requires highly doped ultra-shallow junctions.

The formation of source/drain extension junctions in CMOS devices is commonly carried out by the implantation of ions in appropriately masked source/drain regions of a silicon substrate with boron (p-type) or arsenic and phosphorous (n-type) dopants. However, ion implantation also creates extensive crystal damage and excess silicon interstitials. Silicon interstitials are displaced silicon atoms created by ion bombardment of the crystalline silicon substrate. In order to activate implanted dopants and remove implantation-induced damages, high temperature annealing at temperature, typically in the range between 800° C. and 1200° C., is needed. During thermal annealing, however, the presence of these excess silicon interstitials greatly enhances (10 to 1000 times the normal) diffusion of dopants through the silicon substrate, and results in a much deeper source/drain junction and a poorer junction profile.

In order to increase dopant concentration and minimize boron enhanced diffusion, advanced annealing techniques like spike annealing or impulse annealing currently are used. The strategy behind these annealing methods is to expose the samples at the peak temperature for little or no dwell time. A patent by Chuang entitled "Method to Improve Resistance Uniformity and Repeatability for Low Energy Ion Implantation", U.S. Pat. No. 6,362,081, discloses using a spike annealing process for recovering the crystalline structure of the damage silicon layer which results from the low energy ion implantation process. The full disclosure of U.S. Pat. No. 6,362,081 is incorporated into this patent. The rapid thermal annealing (RTA) is executed by rapidly heating the silicon layer to a specific temperature and then instantaneously lowering the specific temperature to a room temperature. The specific temperature is 1100° C.

However, stability of those junctions formed by spike annealing is very poor. Dopant stabilization is important to device performance. If spike annealing cannot repair the implantation damage completely, or if new interstitial sources are generated during spike annealing, the interstitials will cause the dopants to redistribute, and deepen the junction depth during subsequent low temperature processes.

Instability is also an issue for junctions fabricated by alternative methods. A patent issued to D. J. Eaglesham and H.-J. Gossmann, entitled "Forming A Semiconductor Layer Using Molecular Beam Epitaxy," U.S. Pat. No. 5,169,798, discloses producing junctions by molecular beam epitaxy (MBE) growth. The full disclosure of U.S. Pat. No. 5,169,798 is incorporated into this patent. It has been shown that junctions formed by MBE are not stable during subsequent thermal processes. Such instability reduces the potential of MBE growth as an intergratable method for junction formation due to necessary high-temperature post-growth steps such as ohmic contact formation. For example, $TiSi_2$, a predominant silicide used for interconnects to CMOS devices, requires a temperature higher than 700° C. to form a low resisitivity, stable phase.

Other related art is disclosed in the following references, all of which are incorporated into this patent by this reference:

1. Lin Shao et al. "Stability of Ultra-Shallow Junction Formed by Low Energy Boron Implant and Spike Annealing". J. Appl. Phys. 92, 5788(2002).
2. P. E. Thompson and J. Bennet, "Formation and Thermal Stability of Ultra-Shallow $p^+$ Junctions in Si and $Si_{1-x}Ge_x$ Formed By Molecular Beam Epitaxy", J. Appl. Phys. 92, 6845 (2002).
3. Aliette Mouroux, et al., "Phase Formation and Resistivity In The Ternary System Ti—Nb—Si", J. Appl. Phys. 86, 2323.

What is needed is a solution to overcome the instability of semiconductor junctions.

BRIEF SUMMARY OF THE INVENTION

The present invention provides a method of forming a microelectronic structure on a semiconductor wafer having a silicon surface layer on a substrate comprising the following steps: implanting dopant ions into the surface layer; cleaning and oxidizing the surface layer, subjecting the structure to a first rapid thermal annealing process, including a first cooling process; subjecting the structure to a second thermal annealing process, including a second cooling process.

The first annealing process, accomplished via rapid annealing, comprises subjecting the structure to thermal annealing with temperature and time of the annealing, as well as the heating and cooling rates, selected such that a majority of dopants are electrically activated, and a majority of substrate damage is repaired. The second annealing process is performed with temperature, duration, and heating and cooling rates selected such that minimal dopant diffusion occurs.

The first annealing process uses a temperature range of 800° C. to 1200° C. for a duration from about a fraction of a second to less than about 1000 seconds, with a ramp-up rate of about 50° C./second to about 1000° C./second. The second annealing process uses a temperature range of 400° C. to 650° C. for a time period of from about 1 second to about 10 hours, and more preferably, from about 60 seconds to about 1 hour. An advantage of the present invention is that it can be used to make structures that are useful in fabrication of microelectronic devices, such as FET or CMOS devices, with significantly enhanced stability during followed thermal processes.

DETAILED DESCRIPTION OF THE INVENTION

Figure 1:
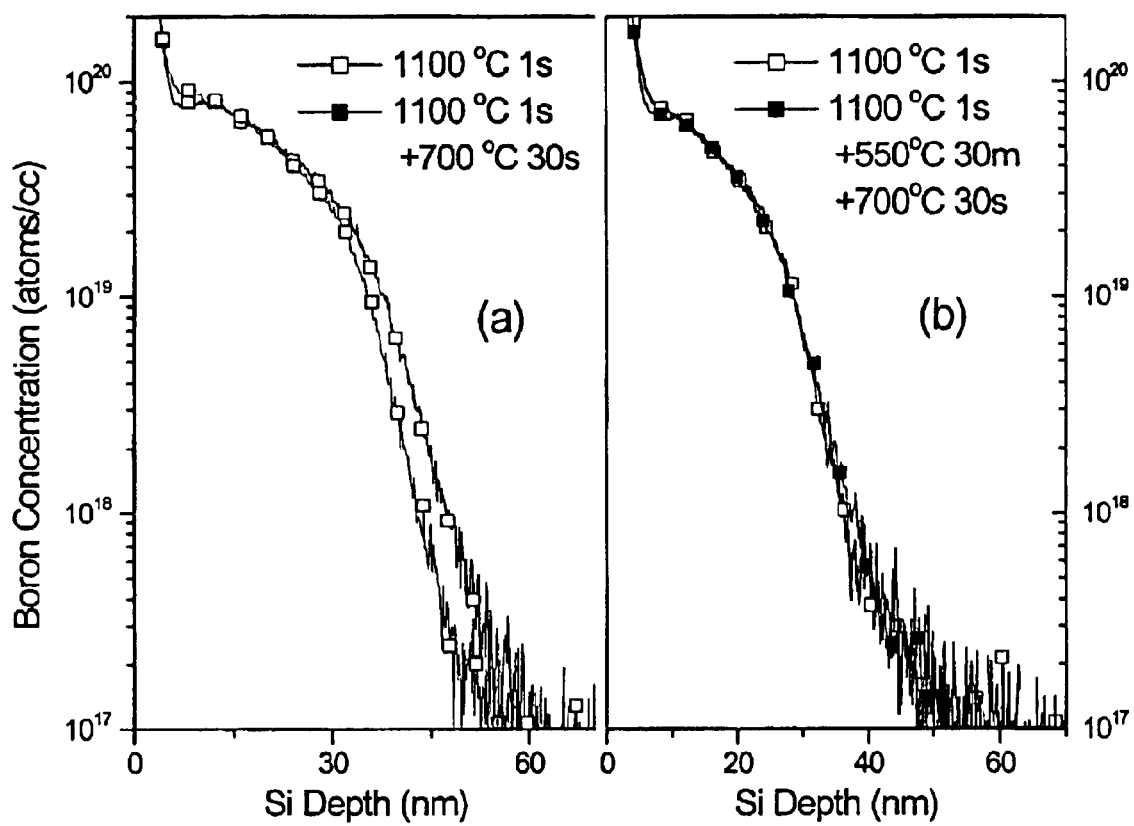
FIG. 1 is a graph that plots boron concentration (atoms/cc) versus depth (Angstrom), depicting SIMS profiles of boron in as-implanted and annealed samples.

The present invention provides a method of fabricating microelectronic structures and devices having a stable ultra-shallow junction. The junction may have a depth of about 10 to 60 nanometers.

As an initial step, dopant atoms are implanted onto the surface of semiconductor substrate. This implantation can be accomplished in various ways. In one embodiment, a single low energy ion implantation step is employed. In another embodiment, multiple implantation steps may be employed, with each implantation step being accomplished at a different energy level. For example, one may utilize a high energy ion implantation step followed by a low energy ion implantation step. High energy implantation is carried out at energy levels from about 200 kiloelectron-volts (keV) to 2000 keV. In this example, suitable first ions that may be implanted by high energy implantation include silicon, germanium, arsenic, indium, gallium, and other ions. The dosage of the high energy ion is typically about $1 \times 10^{13}$ ions/cm$^2$ to about $1 \times 10^{16}$ ions/cm$^2$.

Low energy energy dopant ions are typically implanted at energy levels from about 50 eV to about 5000 eV. Dosages of low implantation ions can range from about $1 \times 10^{13}$ ions/cm$^2$ to about $1 \times 10^{16}$ ions/cm$^2$. The particular identity of the dopant ion or ions for low energy ion implantation depends on the type of junction being formed. For example, if a p-type junction is being formed, the dopant ion is usually boron. When an n-type junction is being formed, the dopant ion is usually arsenic, phosporus, or antimony. The source of the dopant ion is usually in the form of a molecular complex ion derived from $BF_2$, $B_{10}H_{14}$ or $As_2$ gas sources.

After conducting the implantation, the semiconductor material is subjected to a first annealing process under conditions that cause substantial annealing of substrate damages, for a period of time sufficient to activate dopants. A rapid thermal annealing process with high ramp-up and ramp-down rates is employed. This first annealing process can be carried out in any non-oxidizing environment such as a vacuum, nitrogen gas, or an inert gas. In a preferred embodiment, the semiconductor material is heated in an inert gas atmosphere from room temperature to a temperature of about 800° C. to about 1200° C., with a ramp-up rate of about 50° C./second to about 1000° C./second. In another preferred embodiment, the semiconductor material is heated from room temperature to a temperature of about 900° C. to about 1100° C. with a ramp-up rate of about 50° C./second to about 500° C./second.

After the desired temperature is reached, the temperature is held for a time period of from about 1 millisecond to about 1000 seconds. Once the desired holding time has elapsed, the semiconductor material is then cooled down to room temperature at a ramp-down rate from about 50° C./s to about 1000° C./s. In a preferred embodiment, the cooling rate is from about 50° C./s to about 500° C./s.

The above-described RTA is carried out using an apparatus containing, for example, a halogen lamp, an arc lamp, a $CO_2$ laser or a microwave cavity or gyratron or an intense hot gas stream. A stationary furnace containing prescribed heating zones could also be used, provided that the furnace contains a means for transferring the semiconductor materials along the different heating zones.

After the first annealing step, the semiconductor material is subjected to a second annealing step. This step can be carried out in any non-oxidizing environment such as a vacuum, nitrogen gas, or inert gas. In a preferred embodiment, the semiconductor material is heated in an inert gas atmosphere at a temperature of about 400° C. to about 650° C. for a period of time about 1 second to 10 hours. In another preferred embodiment, the annealing temperature is from 400° C. to 650° C. for a period of time from 1 minute to 5 hours. In the most preferred embodiment, the annealing temperature is from 500° C. to 650° C. for a period of time from 1 minute to 1 hour. Equipment used for the second annealing step can be those used in RTA, or, preferably, a stationary furnace. The semiconductor material can be loaded in the heating zone with temperature increased from the room temperature to the desired temperature, or pushed into the hot zone when a processor has obtained desired temperatures. After the annealing, the semiconductor material can be "naturally" cooled down or pulled out from the heating zone. The ramp-up and ramp-down rate for the secondary step annealing can be 0.01° C./s to 1000° C./s.

The following examples are given to illustrate the scope of the present invention. Because these examples are given for illustration purposes only, the invention should not be limited to these examples.

EXAMPLE 1

In this example, an n-type Czochralski-grown silicon (100) wafer was implanted at room temperature with boron ions at an energy of 0.2 keV to a dosage of $1 \times 10^{15}$ ions/cm$^2$. The wafer was then annealed at 1100° C. for 1 second. Annealing was performed with a commercial AG 210 T rapid thermal processor under flowing nitrogen gas. This system uses tungsten filament lamps in a quartz chamber to perform RTA on 4-inch wafers. A typical ramp-down rate for the RTA system is about 100° C./s. After RTA, samples were then annealed at 700° C. to study the thermal stability of junctions. Diffusion profiles after annealing were measured using secondary ion mass spectrometry (SIMS). After 0.2 keV boron implantation, the samples were spike annealed at 1100° C. for 1 sec., followed by furnace annealing at 700° C. for 30 seconds.

Referring now to FIG. 1(a), it shows SIMS profiles of boron in the silicon samples, after 1100° C. spike annealing and additional furnace annealing at 700° C. FIG. 1(a) shows that 1100° C. for one second spike annealing is not stable at 700° C. Anomalous diffusion was observed for the samples annealed at 700° C. for 30 seconds with a diffusion length of around 5 nanometers measured at $1\times10^{18}/cm^3$.

Referring now to FIG. 1(b), the inventors added a low temperature annealing between the 1100° C. RTA and 700° C. annealing. The spike-annealed sample was furnace annealed at 550° C. for 30 minutes followed by a 700° C. RTA for 30 seconds. Compared with control samples that had not undergone 550° C. annealing, the samples that underwent 550° C. annealing showed no observable diffusion from SIMS. This indicated that an annealing at 550° C. for 30 minutes stabilized the junction.

Figure 2:
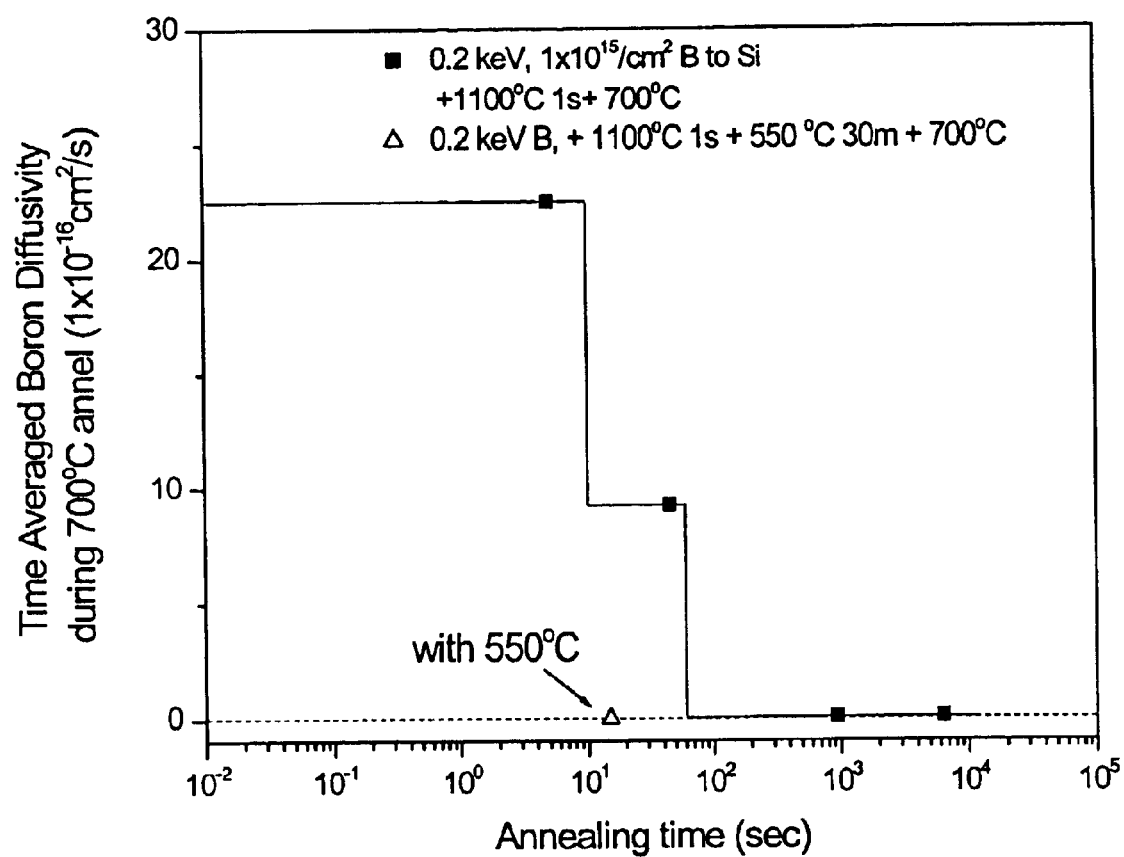
FIG. 2 is a graph that plots boron diffusivity versus annealing time (seconds), depicting diffusivities extracted from FIG. 1, and from SIMS profiles of samples annealed under other temperatures.

FIG. 2 shows B diffusivities extracted from FIG. 1 and from SIMS profiles of samples annealed under other temperatures. The result clearly demonstrates the effectiveness of the second annealing step to increase the stability of a junction formed by spike annealing. With 550° C. annealing, B diffusivities following 700° C. was significantly reduced.

This invention can be used to stabilize junctions formed by other methods. For example, the shallow junctions formed by MBE growth or laser annealing face the same issue of instability. The procedure of the present invention can be widely applied to junctions formed by various non-equilibrium processes. Thus, the invention is also a method of forming a microelectronic structure on a semiconductor material by molecular beam epitaxy growth, comprising the steps of:

a. exposing, in a vacuum chamber, a single crystal semiconductor body to a flux of one or more atomic or molecular species, with the body maintained at a temperature greater than about 100° C. and less than about 800° C.;

b. depositing a single crystal epitaxial layer with doped atoms that are electrically active; and c. subjecting the semiconductor material to a post-growth annealing process.

More specifically, the invention is a method as described, wherein the post growth annealing process occurs in situ in one selected from the group consisting of: a vacuum, nitrogen gas, and inert gas. Even more specifically, the invention is a method as described, wherein the annealing process comprises heating the semiconductor material with such temperature, amount of time, and heating and cooling rates so that minimal dopant diffusion occurs.

While this invention has been described fully and completely, it should be understood that, within the scope of the appended claims, the invention can be practiced other than as specifically described. Although the invention has been disclosed with reference to its preferred embodiments, from reading this description those of skill in the art can appreciate the fact that changes and modifications may be made which do not depart from the scope and spirit of the invention as described above, and as claimed in the following claims.

We claim:

1. A method of forming a microelectronic structure on a semiconductor material having a silicon surface layer on a substrate, comprising the steps of:

a. implanting first dopant ions onto the surface layer;

b. subjecting the semiconductor material to a first annealing process; and c. subjecting the semiconductor material to a second annealing process, wherein the step of implanting first dopant ions comprises at least one high energy implantation step greater than 200 keV, and at least one low energy implantation step less than 5 keV.

2. The method of claim 1, wherein the high-energy ion implantation step is carried out:

a. at an energy level of about 200 keV to about 2000 keV; and b. with a dosage from $1\times10^{13}/cm^2$ to $1\times10^{17}/cm^2$.

3. A method of forming a microelectronic structure on a semiconductor material having a silicon surface layer on a substrate, comprising the steps of:

a. implanting first dopant ions onto the surface layer;

b. subjecting the semiconductor material to a first annealing process; and c. subjecting the semiconductor material to a second annealing process, wherein the second annealing process comprises heating the semiconductor material at a temperature from about 400° C. to about 650° C., for a time period from about 1 second to about 10 hours.

4. A method of forming a microelectronic structure on a semiconductor material by molecular beam epitaxy growth, comprising the steps of:

a. exposing in a vacuum chamber, a single crystal semiconductor body to a flux of one or more atomic or molecular species, with the body maintained at a temperature greater than about 100° C. and less than about 800° C.;

b. depositing a single crystal epitaxial layer with doped atoms that are electrically active; and c. subjecting the semiconductor material to a post-growth annealing process, wherein the annealing process comprises heating the semiconductor material with such temperature, amount of time, and heating and cooling rates so that minimal dopant diffusion occurs.

* * * * *